(12) United States Patent
Kishi et al.

(10) Patent No.: US 9,774,296 B2
(45) Date of Patent: Sep. 26, 2017

(54) CRYSTAL UNIT, OSCILLATOR, AND METHOD FOR FABRICATING THE CRYSTAL UNIT

(71) Applicant: FUJITSU LIMITED, Kawasaki-shi, Kanagawa (JP)

(72) Inventors: Masakazu Kishi, Kawasaki (JP); Hajime Kubota, Kawasaki (JP); Masayuki Itoh, Kawasaki (JP); Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/248,768

(22) Filed: Aug. 26, 2016

(65) Prior Publication Data
US 2017/0093335 A1    Mar. 30, 2017

(30) Foreign Application Priority Data

Sep. 28, 2015   (JP) .................. 2015-190330

(51) Int. Cl.
*H03B 5/32*    (2006.01)
*H03B 15/00*   (2006.01)
*H03B 5/36*    (2006.01)
*H03B 1/02*    (2006.01)

(52) U.S. Cl.
CPC ............. *H03B 5/32* (2013.01); *H03B 1/02* (2013.01); *H03B 5/36* (2013.01); *H03B 15/00* (2013.01)

(58) Field of Classification Search
CPC . H03B 5/36; H03B 1/02; H03B 15/00; H03B 5/32
USPC ........ 310/311, 312, 323.06; 331/158, 107 A, 331/107 SL, 108 C, 68
See application file for complete search history.

(56) References Cited

U.S. PATENT DOCUMENTS

2013/0335157 A1*  12/2013  Ishii .................. H01L 41/0475
                                                    331/158
2016/0163451 A1*  6/2016   Wang .................. H01F 41/042
                                                    336/192

FOREIGN PATENT DOCUMENTS

| JP | 2-226905 | 9/1990 |
| JP | 2013-258571 | 12/2013 |
| JP | 2014-23015 | 2/2014 |

* cited by examiner

*Primary Examiner* — Arnold Kinkead
(74) *Attorney, Agent, or Firm* — Staas & Halsey LLP

(57) ABSTRACT

A crystal unit includes a crystal substrate, a pair of excitation electrodes formed respectively on both surfaces of the crystal substrate, and a coil pattern formed around at least one of the pair of excitation electrodes. An oscillator includes a package and a crystal unit accommodated in the package. The crystal unit includes a crystal substrate, a pair of excitation electrodes formed respectively on both surfaces of the crystal substrate, and a coil pattern formed around at least one of the pair of excitation electrodes. An oscillation circuit is accommodated in the package and electrically connected to the crystal unit.

12 Claims, 21 Drawing Sheets

FIG. 21

|  | MOUNTING AREA | INDUCTANCE | PRODUCTION COST |
|---|---|---|---|
| CONVENTIONAL EXAMPLE | × | ○ | △ |
| FIRST COMPARATIVE EXAMPLE | × | ○ | × |
| SECOND COMPARATIVE EXAMPLE | ○ | ○ | × |
| THIRD COMPARATIVE EXAMPLE | ○ | × | △ |
| FOURTH COMPARATIVE EXAMPLE | ○ | ○ | × |
| FIRST TO FOURTH EMBODIMENTS | ○ | ○ | ○ |

CRYSTAL UNIT, OSCILLATOR, AND METHOD FOR FABRICATING THE CRYSTAL UNIT

CROSS-REFERENCE TO RELATED APPLICATION

This application is based upon and claims the benefit of priority of the prior Japanese Patent Application No. 2015-190330, filed on Sep. 28, 2015, the entire contents of which are incorporated herein by reference.

FIELD

The embodiments discussed herein are related to a crystal unit with a built-in coil, an oscillator, and a method for fabricating the crystal unit with a built-in coil.

BACKGROUND

In an oscillation circuit such as a 3× ($3^{rd}$) overtone oscillation circuit or an oscillator used as a voltage controlled crystal oscillator (VCXO), a coil (or an inductor) called an "extension coil" is typically connected in series in order to secure a variable frequency bandwidth. A coil is a discrete part, and its size is roughly determined by an inductance required for the coil, which hinders miniaturization of the entire oscillation circuit and oscillator.

FIG. 1 is a circuit diagram illustrating an example of an oscillator. The oscillator 1 illustrated in FIG. 1 includes a $3^{rd}$ overtone oscillation circuit as an example of an oscillation circuit, a crystal unit 2, and an extension coil 3. The $3^{rd}$ overtone oscillation circuit includes resistors R1 to R3, an inductor L1, capacitors C1 to C6, a variable capacitor C7, and a transistor Tr, all of which are connected as illustrated in FIG. 1. A power source voltage is applied to a terminal T4, and an output signal of the oscillator 1 is output from a terminal 5. An inductance value of the extension coil 3 is, for example, several μH or so.

FIGS. 2A to 2C illustrate an example of a conventional crystal unit 200, FIG. 2A being a plan view of the crystal unit 200, FIG. 2B being a sectional view of the crystal unit 200, which is taken along a dashed line B-B in FIG. 2A, and FIG. 2C being a sectional view of the crystal unit 200, which is taken along a dashed line C-C in FIG. 2A. In FIGS. 2A to 2C, the crystal unit 200 includes a package 21 made of, e.g., ceramics or the like, a pair of excitation electrodes 22, a crystal substrate 23, a conductive adhesive 24, four electrodes 25-1 to 25-4, and wirings 26-1 and 26-2. The pair of excitation electrodes 22 is disposed on both surfaces of the crystal substrate 23 with the crystal substrate 23 sandwiched therebetween. For example, the lower excitation electrode 22 is electrically connected to the electrode 25-1 by the conductive adhesive 24 via the wiring 26-1. In the sectional view of FIG. 2B, for the purpose of facilitating the understanding of the electrical connection, the wiring 26-1 and the electrode 25-1 (and the electrode 25-2), which are originally invisible, are indicated by a dashed line for the sake of convenience. The upper excitation electrode 22 is electrically connected to the electrode 25-2 by the conductive adhesive 24 via the wiring 26-2. In the sectional view of FIG. 2C, for the purpose of facilitating the understanding of the electrical connection, the wiring 26-2 and the electrode 25-2 (and the electrode 25-1), which are originally invisible, are indicated by a dashed line for the sake of convenience. The wiring 26-1 includes a via connected to the electrode 25-1 through the package 21. Similarly, the wiring 26-2 includes a via connected to the electrode 25-2 through the package 21. In this case, the electrodes 25-3 and 25-4 are not electrically connected to the excitation electrode 22 and may be used as, e.g., pads when the package 21 is installed. However, the electrodes 25-3 and 25-4 may be electrically connected to the excitation electrode 22.

The size of the package 21 on the plan view is, for example, 3.2 mm×2.5 mm, as illustrated in FIG. 2A, and the height of the package 21 on the side view is, for example, 0.5 mm to 0.7 mm, as illustrated in FIGS. 2B and 2C. When a chip coil, which is a discrete part, is used for the extension coil 3 having the inductance of several μH or so as mentioned above, the size of the chip coil is, for example, 1.0 mm×0.5 mm×0.5 mm. However, when the chip coil is connected to the crystal unit 200 as illustrated in FIGS. 2A to 2C, the size of the portion surrounded by a dashed line in FIG. 1 becomes relatively large, which makes it difficult to miniaturize the oscillator 1.

Therefore, it is conceivable to use an extension coil, which is not a discrete part, for the crystal unit. However, when this chip coil is disposed in the side of the crystal unit within the package, the occupation area of the package increases, which makes it difficult to miniaturize the oscillator 1. Meanwhile, when this chip coil is disposed above or below the crystal unit within the package, although the mounting area corresponding to the chip coil may be reduced as compared to the case where the chip coil is disposed in the side of the crystal unit, the height of the package increases, which also makes it difficult to miniaturize the oscillator 1. In addition, when the chip coil is made thin, it is difficult to obtain the inductance of, e.g., several μH or so required for the extension coil.

In this way, it is difficult to miniaturize the crystal unit with a built-in a coil where an extension coil is built-in since the size of the extension coil is roughly determined by the inductance required for the extension coil.

It is difficult to install a coil without compromising the size of the crystal unit with a built-in coil.

The followings are a reference documents.

[Document 1] Japanese Laid-Open Patent Publication No. 2014-023015,

[Document 2] Japanese Laid-Open Patent Publication No. 2013-258571, and

[Document 3] Japanese Laid-Open Patent Publication No. 02-226905.

SUMMARY

According to an aspect of the invention, a crystal unit includes: a crystal substrate; a pair of excitation electrodes formed respectively on both surfaces of the crystal substrate; and a coil pattern formed around at least one of the pair of excitation electrodes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 21 is a table illustrating results of evaluation on a mounting area, an inductance and a production cost for the conventional example, the first to fourth examples, and the first to fourth embodiments.

DESCRIPTION OF EMBODIMENTS

In one aspect, a pattern serving as both of an excitation electrode and a coil is formed on at least one of surfaces of a crystal substrate.

Hereinafter, exemplary embodiments of a crystal unit with a built-in a coil, an oscillator, and a method for fabricating the coil built-in crystal unit will be described with reference to the drawings. Throughout the drawings, each part is schematically illustrated, and the size (length, width, and thickness) thereof is not drawn to scale.

Embodiments

To begin with, some comparative examples of a coil built-in crystal unit which does not use an extension coil which is a discrete part for a crystal unit will be described.

Figure 2A:
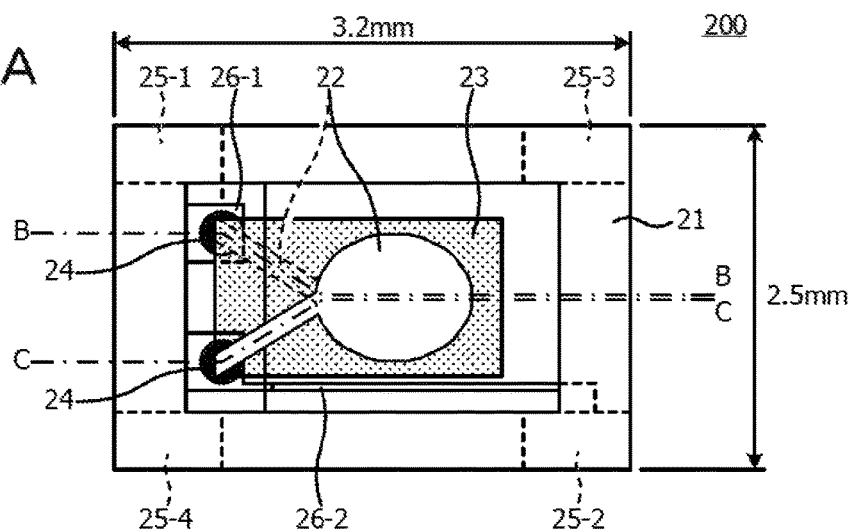
FIGS. 2A to 2C are views illustrating an example of a conventional crystal unit.
Figure 2B:
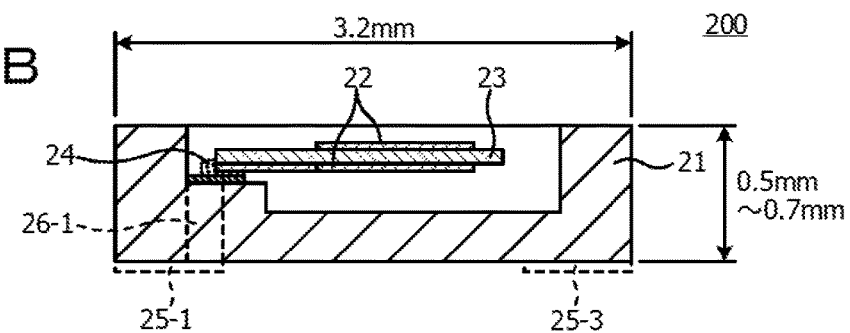
Figure 2C:
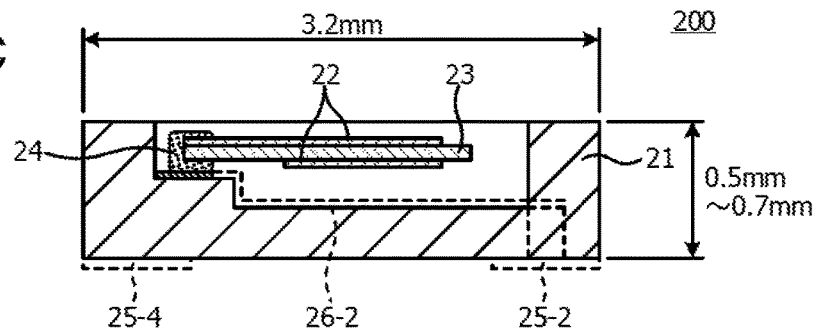
Figure 3A:
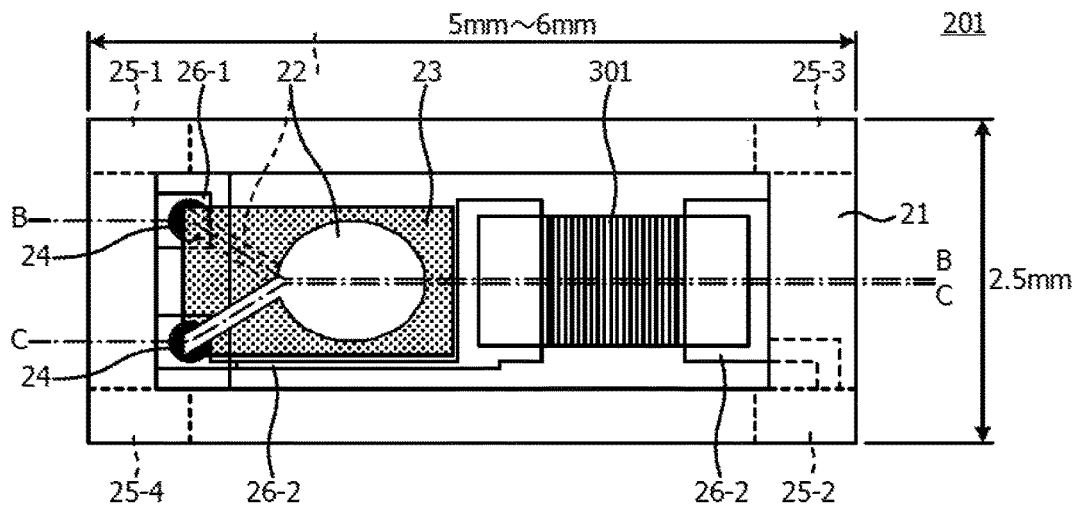
FIGS. 3A to 3C are views illustrating a first comparative example of a crystal unit.
Figure 3B:
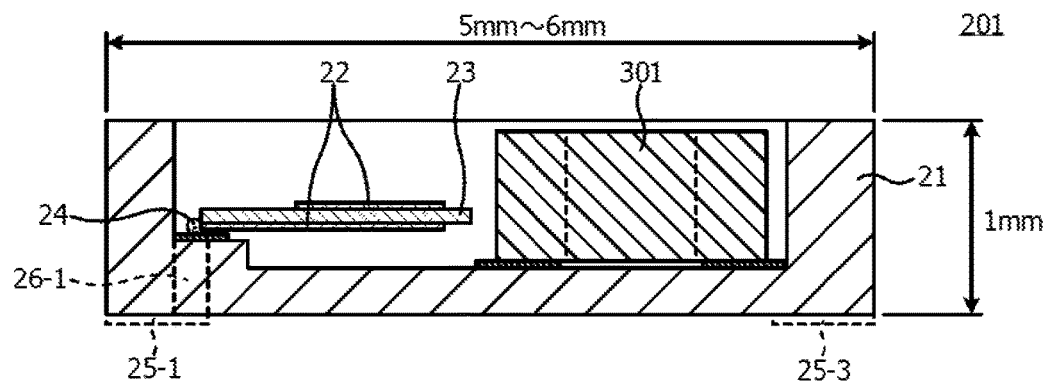
Figure 3C:
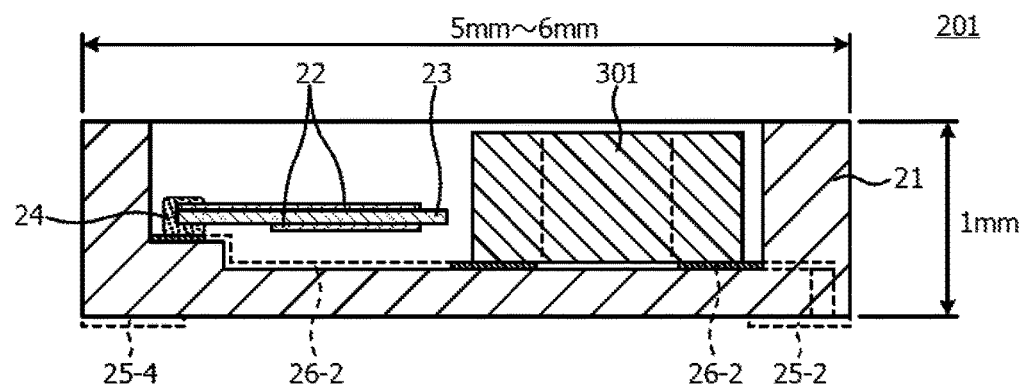

FIGS. 3A to 3C are views illustrating a first comparative example of a crystal unit. In FIGS. 3A to 3C, substantially the same parts as those in FIGS. 2A to 2C will be denoted by the same reference numerals as used in FIGS. 2A to 2C, and explanation of which will be omitted. FIG. 3A is a plan view of a crystal unit 201, FIG. 3B is a sectional view of the crystal unit 201, which is taken along an alternate long and short dashed line B-B in FIG. 3A, and FIG. 3C is a sectional view of the crystal unit 201, which is taken along a dashed line C-C in FIG. 3A.

In the first comparative example, a chip coil 301 is simply disposed on a wiring 26-2 within a package 21 of the crystal unit 201. However, the size of the chip coil 301 having an inductance of several μH or so is, for example, 1.0 mm×0.5 mm×0.5 mm, as mentioned above. Therefore, the package size of the package 21 is, for example, about 5 mm to 6 mm×2.5 mm×1 mm, which makes it difficult to miniaturize an oscillator.

Figure 4A:
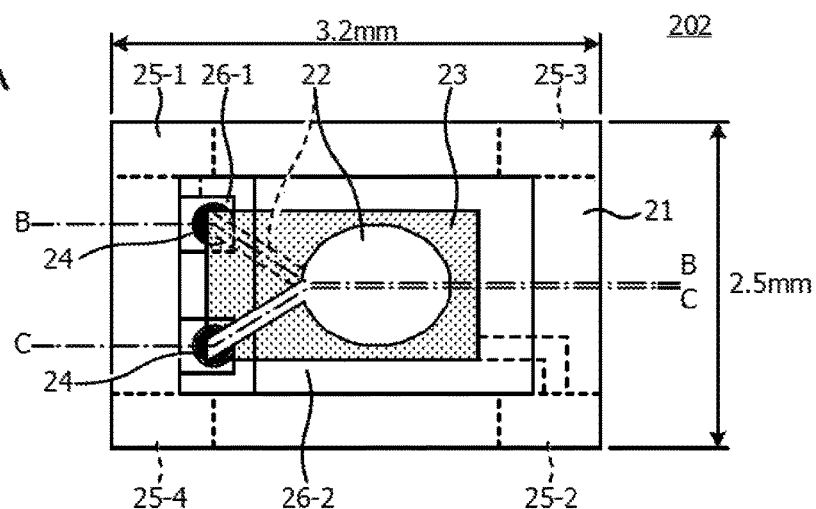
FIGS. 4A to 4C are views illustrating a second comparative example of a crystal unit.
Figure 4B:
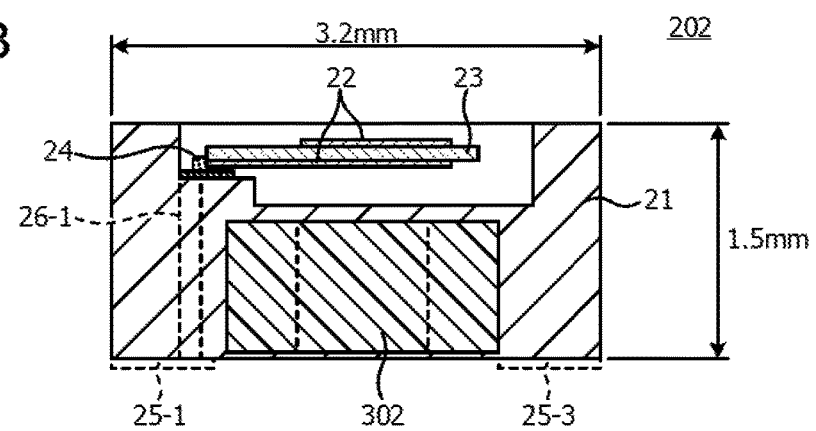
Figure 4C:
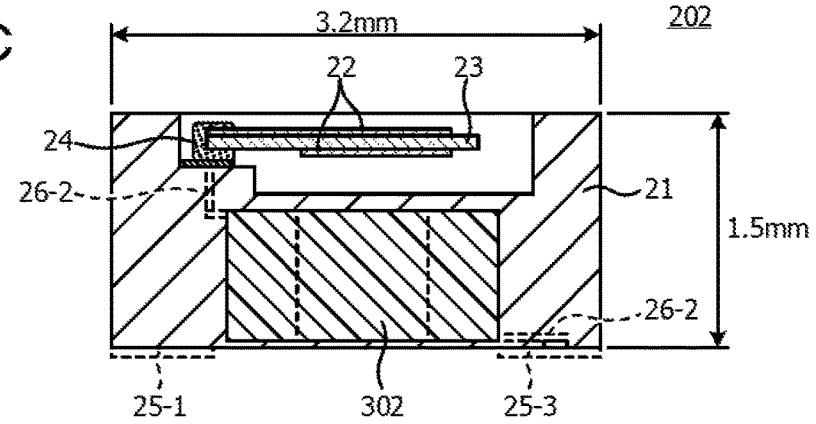

FIGS. 4A to 4C are views illustrating a second comparative example of a crystal unit. In FIGS. 4A to 4C, substantially the same parts as those in FIGS. 2A to 2C will be denoted by the same reference numerals as used in FIGS. 2A to 2C, and explanation of which will be omitted. FIG. 4A is a plan view of a crystal unit 202, FIG. 4B is a sectional view of the crystal unit 202, which is taken along an alternate long and short dashed line B-B in FIG. 4A, and FIG. 4C is a sectional view of the crystal unit 202, which is taken along an alternate long and short dashed line C-C in FIG. 4A.

In the second comparative example, a laminated coil 302 is disposed on a wiring 26-2 within a package 21 at a lower side of the crystal unit 201. In this case, although a mounting area corresponding to the coil is small, the height of the package 21 increases to about 1.5 mm, which makes it difficult to miniaturize an oscillator. In addition, an upper portion of the package 21 where the crystal unit 202 is formed has fewer thick layers, whereas a lower portion of the package 21 where the laminated coil 302 is formed has more thin layers. Therefore, the upper and lower portions of the package 21 undergo different fabricating processes, which results in an increase in production costs.

Figure 5A:
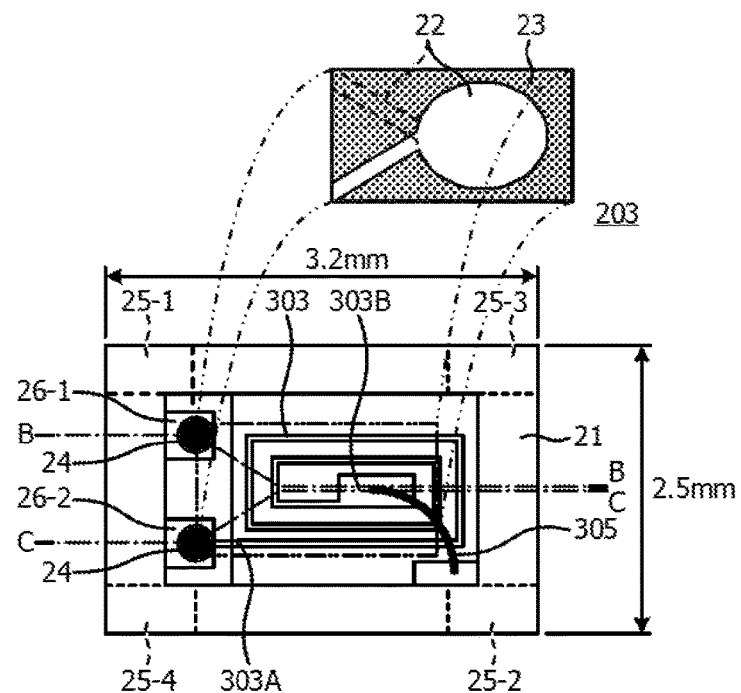
FIGS. 5A to 5C are views illustrating a third comparative example of a crystal unit.
Figure 5B:
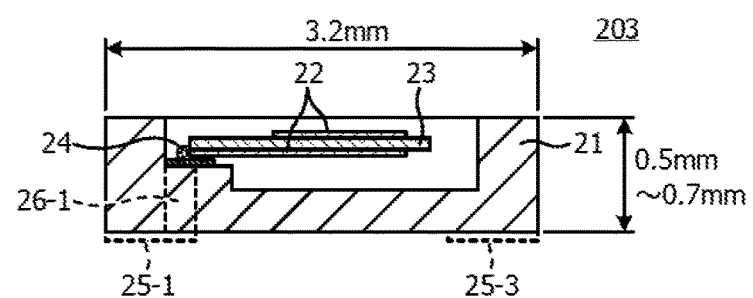
Figure 5C:
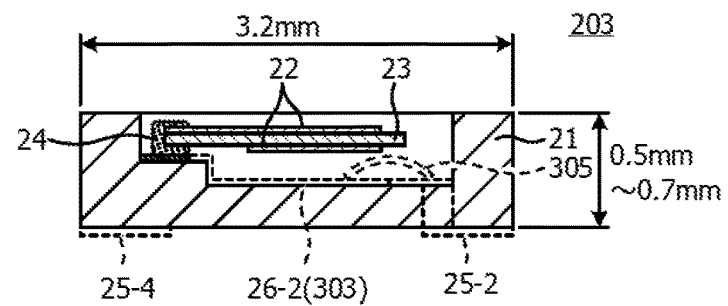

FIGS. 5A to 5C are views illustrating a third comparative example of a crystal unit. In FIGS. 5A to 5C, substantially the same parts as those in FIGS. 2A to 2C will be denoted by the same reference numerals as used in FIGS. 2A to 2C, and explanation of which will be omitted. FIG. 5A is a plan view of a crystal unit 203, FIG. 5B is a sectional view of the crystal unit 203, which is taken along an alternate long and short dashed line B-B in FIG. 5A, and FIG. 5C is a sectional view of the crystal unit 203, which is taken along an alternate long and short dashed line C-C in FIG. 5A. A crystal substrate 23 and a pair of excitation electrodes 22 illustrated in the upper left of FIG. 5A are disposed at a position indicated by an alternate long and two short dashed line.

In the third comparative example, in an internal space of the package 21 where the crystal unit 203 is installed, a pattern 303 having an inductance component is formed on a surface of the package 21 which faces the crystal unit 203. The pair of excitation electrodes 22 with the crystal substrate 23 sandwiched therebetween is disposed above the pattern 303 in a side view in the internal space. An end portion 303A of the pattern 303 is electrically connected to the upper excitation electrode 22, and a central portion 303B of the pattern 303 is electrically connected to an electrode 25-2 by a wire bonding 305 via a wiring 26-2. However, in general, a width of the pattern 303 which may be formed on the surface of the package 21 in the package 21 generally made of ceramics or the like is, for example, about 100 μm, and a line length of about 120 mm is required to obtain an inductance of several μH or so, which makes it difficult to miniaturize an oscillator. In addition, the use of the wire bonding 305 contributes to increase in production costs.

In order to obtain an inductance of several μH or so, it is conceivable to form the pattern 303 having a width of, e.g., 1 μm. In this case, it may be considered to make the interior of the package 21 flat by polishing after completion of the package 21 and form the pattern 303 by photolithography. However, it is difficult to perform the polishing for flatness of the interior of the package 21. Further, the pattern 303 is a thin film for miniaturization, whereas electrodes 21-1 and 21-2 and others of the bottom surface of the package 21 are thick films for heat resistance in soldering. Therefore, even when the pattern 303 of a miniaturized thin film could be formed, it may be necessary to provide the interior and the bottom surface of the package 21 with different fabricating processes, which results in an increase in production costs. In addition, it is difficult to achieve the coexistence of the thin pattern 303 and the thick electrodes 21-1 and 21-2 on the bottom surface of the package 21 in a fabricating process.

Figure 6A:
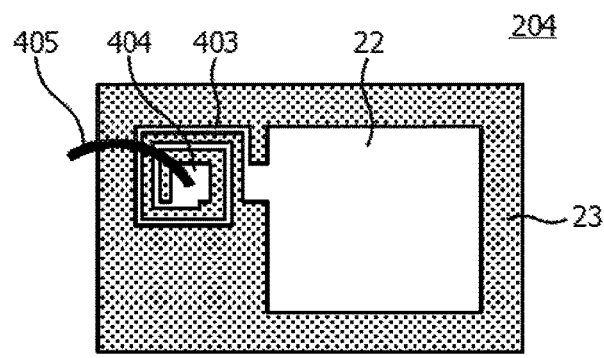
FIGS. 6A to 6C are views illustrating a fourth comparative example of a crystal unit.
Figure 6B:
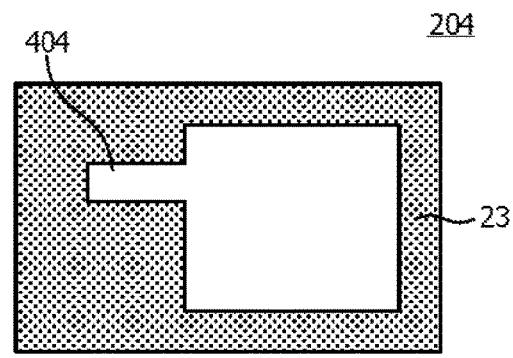
Figure 6C:
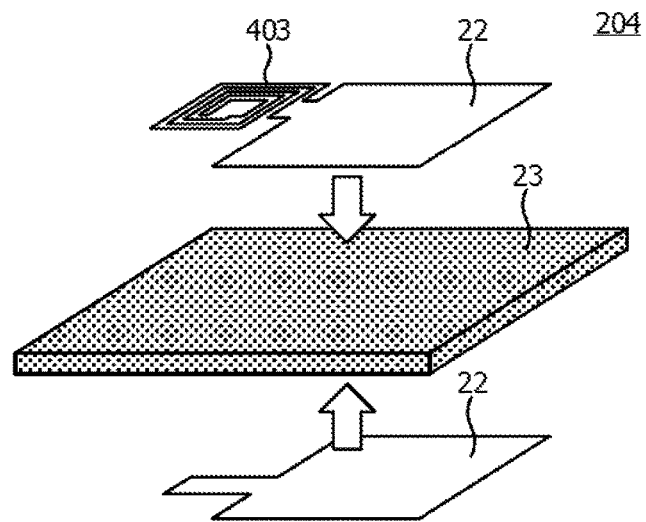

FIGS. 6A to 6C are views illustrating a fourth comparative example of a crystal unit. In FIGS. 6A to 6C, substantially the same parts as those in FIGS. 2A to 2C will be denoted by the same reference numerals as used in FIGS. 2A to 2C, and explanation of which will be omitted. FIG. 6A is a top view of a crystal unit 204, FIG. 6B is a bottom view of the crystal unit 204, and FIG. 6C is an exploded perspective view of the crystal unit 204. Illustration of package, electrodes or others is omitted in these figures.

In the fourth comparative example, as illustrated in FIGS. 6A and 6C, a spiral coil 403 and a drawing-out pad 404 are disposed adjacent and electrically connected to an upper excitation electrode 22 of a crystal substrate 23. In addition, as illustrated in FIGS. 6B and 6C, the drawing-out pad 404 is electrically connected to a lower excitation electrode 22 of the crystal substrate 23. Such a configuration requires a wiring via a wire bonding or an insulating film for connection with an external side. Although an inductance of the spiral coil 403 may be controlled by photolithography, the drawing-out pad 404 is connected to the external side by a wire bonding 405 or the like, which results in an increase in production costs. In addition, instead of using the wire boding 405, when the drawing-out pad 404 is electrically connected to a lead electrode by a conductive adhesive, an amount of the conductive adhesive has to be controlled in accordance with the size of the drawing-out pad 404, which makes a fabricating process complicated. In addition, when the size of the drawing-out pad 404 is increased to facilitate the control of the amount of the conductive adhesive, it is difficult to obtain an inductance of several μH or so with the spiral coil 403.

In contrast to the aforementioned first to fourth comparative examples, the following embodiments involve forming a coil, which is installed around an excitation electrode, on at least one of surfaces of a crystal substrate. That is, by installing a pattern of the coil around the excitation electrode, an inductance component is provided to the excitation electrode.

Figure 7A:
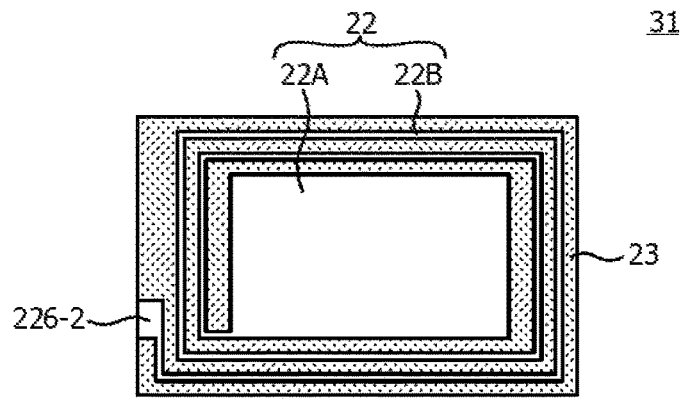
FIGS. 7A to 7C are views illustrating a crystal unit according to a first embodiment.
Figure 7B:
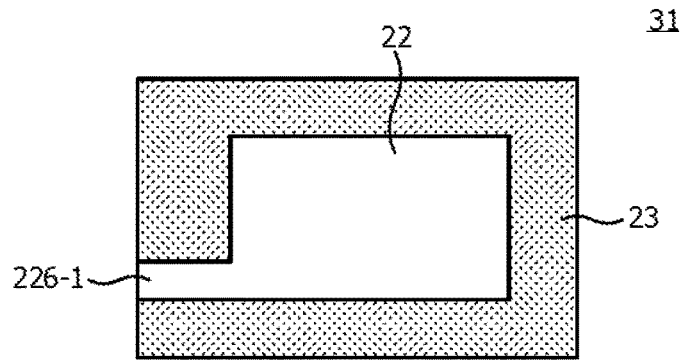
Figure 7C:
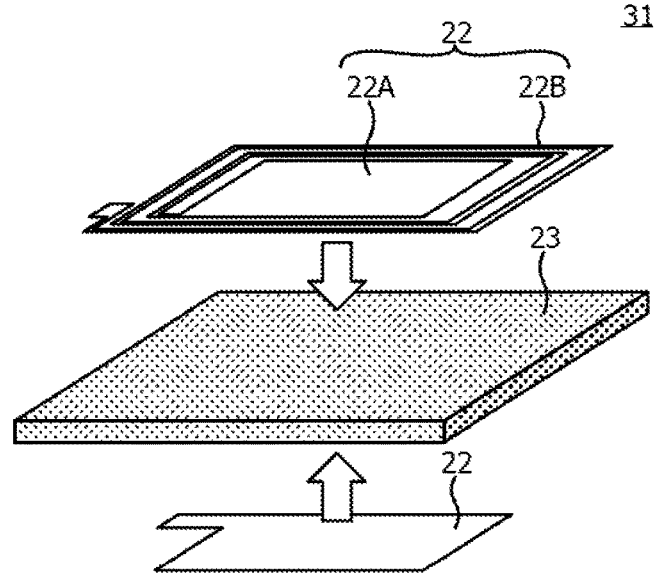

FIGS. 7A to 7C are views illustrating a crystal unit according to a first embodiment. In FIGS. 7A to 7C, substantially the same parts as those in FIGS. 2A to 2C will be denoted by the same reference numerals as used in FIGS. 2A to 2C, and explanation of which will be omitted. FIG. 7A is a top view of a crystal unit 31 as an example of a coil built-in crystal unit, FIG. 7B is a bottom view of the crystal unit 31, and FIG. 7C is an exploded perspective view of the crystal unit 31. Illustration of package, electrodes or others is omitted in these figures.

In the first embodiment, as illustrated in FIGS. 7A and 7C, an upper excitation electrode 22 of a crystal substrate 23 includes a rectangular pattern 22A corresponding to an excitation electrode (hereinafter referred to as an "excitation electrode pattern") and a rectangular spiral pattern 22B which is formed around the excitation electrode pattern 22A and corresponds to a coil (hereinafter referred to as a "coil pattern") so as to provide an inductance component corresponding to an extension coil to the upper excitation electrode 22. The coil pattern 22B is placed to surround the excitation electrode pattern 22A. A drawing-out pad 226-2 at an end portion of the coil pattern is electrically connected to an electrode 25-2 (not illustrated) by a conductive adhesive 24 (not illustrated) via a wiring 26-2 (not illustrated). Meanwhile, as illustrated in FIGS. 7B and 7C, a drawing-out pad 226-1 of a lower excitation electrode 22 of the crystal substrate 23 is electrically connected to an electrode 25-1 (not illustrated) by a conductive adhesive 24 (not illustrated) via a wiring 26-1 (not illustrated). The upper excitation electrode 22 having the inductance component corresponding to the extension coil and the lower excitation electrode 22 may be exchanged.

In this embodiment, the coil pattern 22B has a rectangular spiral shape in accordance with the rectangular excitation electrode pattern 22A. However, the shapes of the excitation electrode pattern 22A and the coil pattern 22B are not particularly limited thereto. The shape of the coil pattern 22B is not particularly limited as long as the coil pattern 22B may be a pattern providing an inductance component corresponding to an extension coil to the upper excitation electrode 22 in accordance with the shape of the excitation electrode pattern 22A. For example, the coil pattern 22B may be a spiral pattern having a circular, elliptical, polygonal shape or the like in accordance with the shape of the excitation electrode pattern 22A of a circular, elliptical, or polygonal shape.

Further, the excitation electrode 22 may have a film configuration including an electrode material containing a magnetic material or an electrode material formed of a magnetic material itself, or a film configuration including a magnetic material for reinforcing an inductance component although it may not directly serve as an electrode material.

A surface of a crystal substrate used for a crystal unit has high flatness, and an excitation electrode may be formed on the substrate surface, e.g., by photolithography. Therefore, the coil pattern 22B providing an inductance component to the upper excitation electrode 22 may be formed at the same time when the excitation electrode pattern 22A is formed. That is, the coil pattern 22B may be formed as a part of the excitation electrode 22 when the excitation electrode pattern 22A is formed. In addition, for example, by using photolithography, the coil pattern 22B having an inductance of, e.g., several μH or so may be formed, as will be described later. In addition, it is to be understood that a method for forming the excitation electrode pattern 22A and the coil pattern 22B is not limited to the photolithography but may employ a charged particle beam exposure technology including an electron beam exposure technology, or the like.

In this embodiment, since the coil pattern corresponding to the extension coil is formed to surround the excitation electrode pattern of at least one excitation electrode, a connection from the excitation electrode to an electrode installed in a package does not intersect with the excitation electrode pattern and the coil pattern, thereby eliminating a need for a wiring which interposes a wire bonding or an insulating film. Therefore, it is possible to fabricate a coil built-in crystal unit using the fabricating process which is the same as the conventional fabricating process of the crystal unit 200 as illustrated in FIGS. 2A to 2C, which may result in a suppression of increase in production costs.

Next, an example of a method for fabricating a coil built-in crystal unit will be described with reference to FIGS. 8A to 15. FIGS. 8A to 14 are views used to explain one example of a method for fabricating a coil built-in crystal unit. FIGS. 8A, 9A, 10A, 11A, 12A, 13A, and 14A are plan views, and FIGS. 8B, 9B, 10B, 11B, 12B, 13B, and 14B are transparent side views. For convenience of explanation, it is assumed in this example that photolithography is used to fabricate the coil built-in crystal unit 31 illustrated in FIGS. 7A to 7C.

Figure 8A:
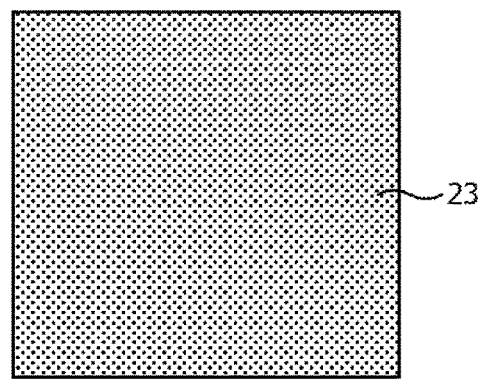
FIGS. 8A and 8B are views used to explain an example of a method for fabricating a crystal unit.
Figure 8B:
Figure 9A:
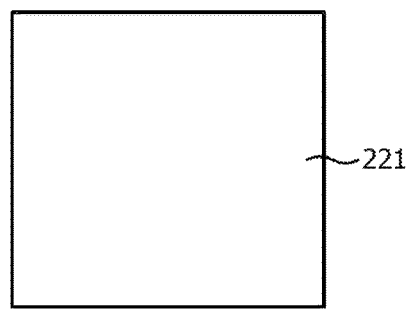
FIGS. 9A and 9B are views used to explain an example of a method for fabricating a crystal unit.
Figure 9B:
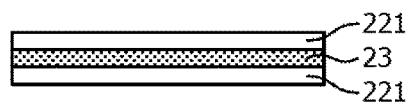
Figure 10A:
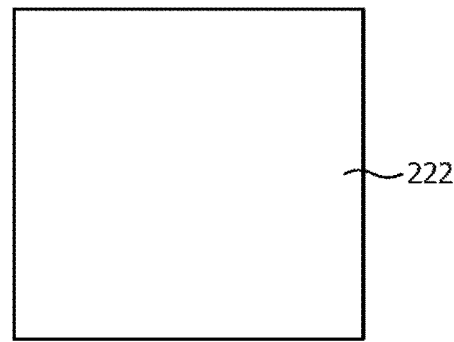
FIGS. 10A and 10B are views used to explain an example of a method for fabricating a crystal unit.
Figure 10B:
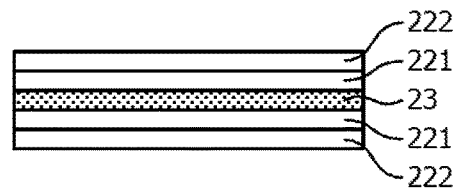

First, as illustrated in FIGS. 8A and 8B, a crystal substrate 23 polished to a thickness corresponding to an oscillation frequency is prepared. Next, as illustrated in FIGS. 9A and 9B, electrode films 221 that become a pattern corresponding to an excitation electrode and/or an extension coil are respectively formed on both surfaces of the crystal substrate 23. The conductive material used for the electrode films 221 is gold, silver, aluminum or the like. In order to increase adhesion strength, a thin film made of nichrome, platinum or the like may be interposed between the conductive material and the crystal substrate 2. Next, as illustrated in FIGS. 10A and 10B, a resist 222 is formed on each of the electrode films 221.

Figure 11A:
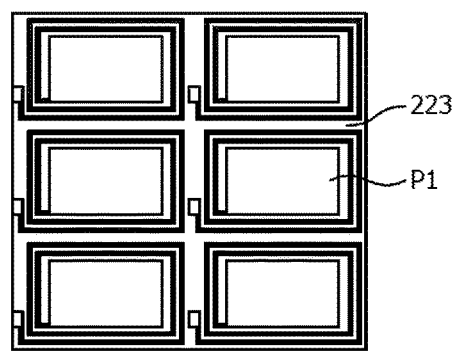
FIGS. 11A and 11B are views used to explain an example of a method for fabricating a crystal unit.
Figure 11B:
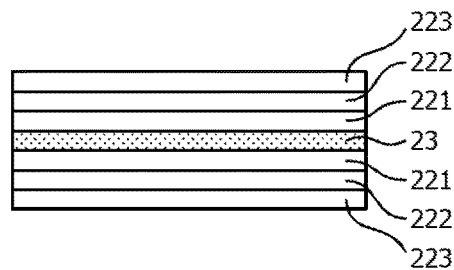

Next, as illustrated in FIGS. 11A and 11B, a mask 223 having a plurality of patterns P1 corresponding to an upper excitation electrode 22A and a coil pattern 22B is placed on an upper resist 222, a mask 223 having a plurality of patterns corresponding to a lower excitation electrode 22 is placed below a lower resist 222, and the resists 222 are exposed with light transmitted through the respective masks 223. The patterns P1 of the mask 223 placed on the upper resist 222 have a shape for providing the upper excitation electrode 22 with an inductance component corresponding to an extension coil. Meanwhile, the patterns of the mask 223 placed below the lower resist 222 have a shape for forming the lower excitation electrode 22.

Figure 12A:
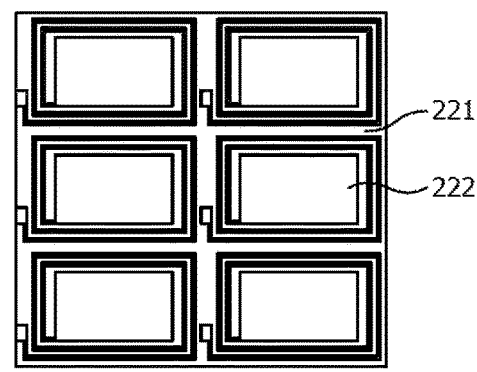
FIGS. 12A and 12B are views used to explain an example of a method for fabricating a crystal unit.
Figure 12B:
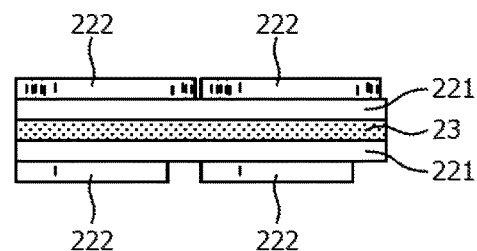
Figure 13A:
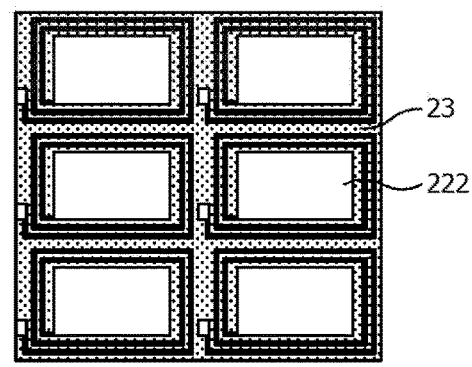
FIGS. 13A and 13B are views used to explain an example of a method for fabricating a crystal unit.
Figure 13B:
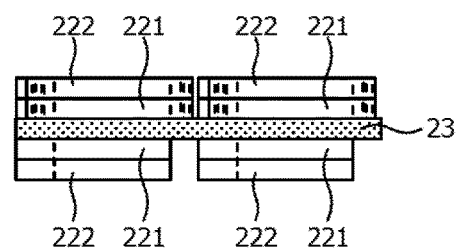
Figure 14A:
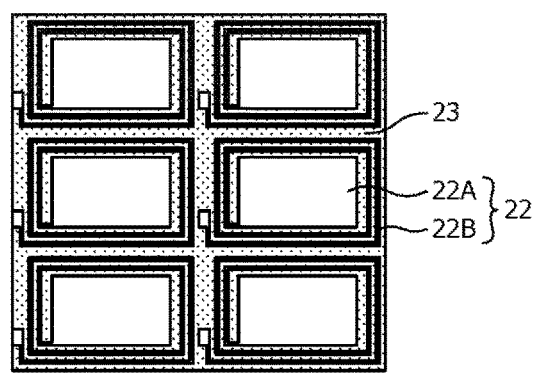
FIGS. 14A and 14B are views used to explain an example of a method for fabricating a crystal unit.
Figure 14B:
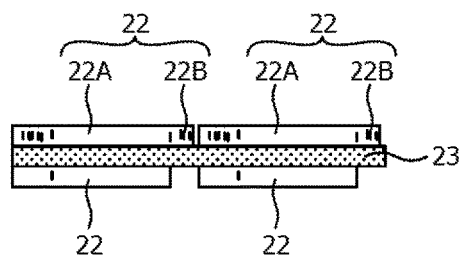
Figure 15:
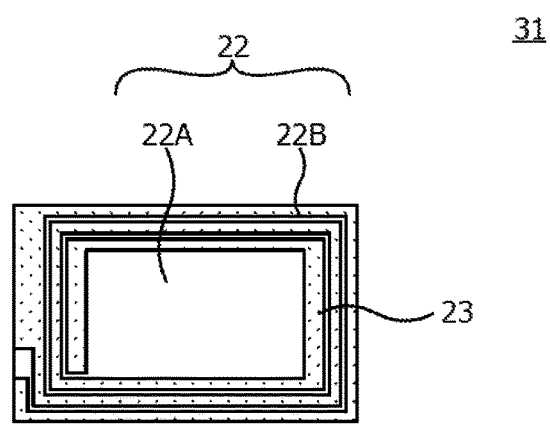
FIG. 15 is a view used to explain an example of a method for fabricating a crystal unit.

Next, as illustrated in FIGS. 12A and 12B, patterns of the exposed resists 222 are developed. In addition, as illustrated in FIGS. 13A and 13B, by etching and patterning the electrode films 221 using the developed patterns of the resists 222 as a mask, the upper electrode film 221 is formed as the excitation electrode pattern 22A and the coil pattern 22B of the upper excitation electrode 22, and the lower electrode film 221 is formed in a pattern of the lower excitation electrode 22. Further, as illustrated in FIGS. 14A and 14B, the resists 222 are removed, and then, as illustrated in FIG. 15, a plurality of chips of the coil built-in crystal unit 31 is formed by cutting the entire body into laminate units, each of which includes the crystal substrate 23 and a pair of excitation electrodes 22, each of which in turn has one excitation electrode pattern 22A and one coil pattern 22B. In addition, although a package is not illustrated, the coil built-in crystal unit 31 may be accommodated in and sealed by the same package as the package 21 illustrated in FIGS. 2A to 2C by a known method.

In addition, when both of the pattern of the upper excitation electrode and the pattern of the lower excitation electrode are to be provided with an inductance component as in a second embodiment which will be described later, the lower electrode film 221 may be subjected to the same process as the process performed for the upper electrode film 221 in the process of FIGS. 11A to 13B.

Here, it is verified whether or not the excitation electrode 22A of a pattern having an inductance of, e.g., several ·H may be formed by typical photolithography. An inductance by a typical strip line is expressed by the following equation in which a pattern length is denoted by L(mm), a pattern width is denoted by W(mm), and a pattern thickness is denoted by H(mm).

$$0.0002L[\ln\{2L/(W+H)\}+0.2235\{(W+H)/L\}+0.5](\mu H)$$

For example, for W=1·m (a gap between strip line is also 1·m), when the pattern is formed to have a rectangular spiral shape, the pattern length L becomes about 120 mm. When the pattern thickness H is 1000 Å, the inductance becomes about 3·H from the above equation, thereby verifying that it is possible to form the excitation electrode 22A of a pattern having an inductance of, e.g., several ·H.

Figure 16A:
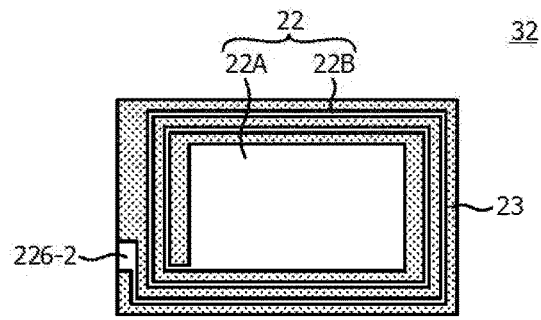
FIGS. 16A to 16C are views illustrating a crystal unit according to a second embodiment.
Figure 16B:
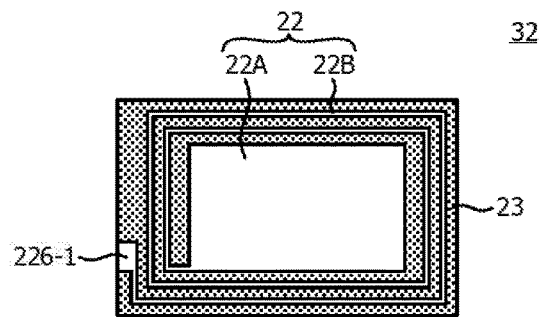
Figure 16C:
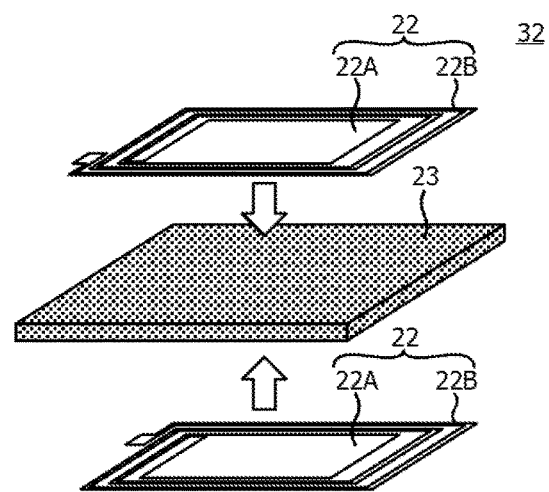

FIGS. 16A and 16B are views illustrating a crystal unit according to a third embodiment. In FIGS. 16A and 16B, substantially the same parts as those in FIGS. 7A to 7C will be denoted by the same reference numerals as used in FIGS. 7A to 7C, and explanation of which will be omitted. FIG. 16A is a top view of a crystal unit 32 as an example of a coil built-in crystal unit, and FIG. 16B is a bottom view of the crystal unit 32, and FIG. 16C is an exploded perspective view of the crystal unit 32. Illustration of package, electrodes or others is omitted in these figures.

In the second embodiment, an upper excitation electrode 22 of a crystal substrate 23 includes a rectangular excitation pattern 22A and a rectangular spiral coil pattern 22B formed around the excitation electrode pattern 22A so as to provide the upper excitation electrode 22 with an inductance component corresponding to an extension coil. In addition, a lower excitation electrode 22 of the crystal substrate 23 includes a rectangular excitation pattern 22A and a rectangular spiral coil pattern 22B formed around the excitation electrode pattern 22A so as to provide the lower excitation electrode 22 with an inductance component corresponding to an extension coil. In each excitation electrode 22, the coil pattern 22B is formed to surround the excitation electrode pattern 22A.

Thus, both of the excitation electrodes 22 may provide a larger inductance component corresponding to an extension coil. In addition, each coil pattern 22B is not limited to the rectangular spiral shape, as in the first embodiment. In addition, even when the upper and lower coil patterns 22B may be the same or different from each other. In addition, when both of the upper and lower coil patterns 22B have the spiral pattern, a spiral direction may be determined in such a manner that inductance components thereof are not cancelled to each other. Inductances of the coil patterns 22B may be the same or different from each other.

For example, in VCXO for a phase locked loop (PLL), in order to cope with a demand for extension of a variable range of an oscillation frequency to, e.g., ±several 100 ppm or so, a coil may be inserted in series in a crystal unit. The second embodiment is suitable to be used for this crystal unit. In general, the variable oscillation frequency range is narrow because of a high Q value of the crystal unit. However, the variable oscillation frequency range may be widened by using the crystal unit 34 providing an inductance component to both of the excitation electrodes 22B-1 and 22B-2.

Figure 17A:
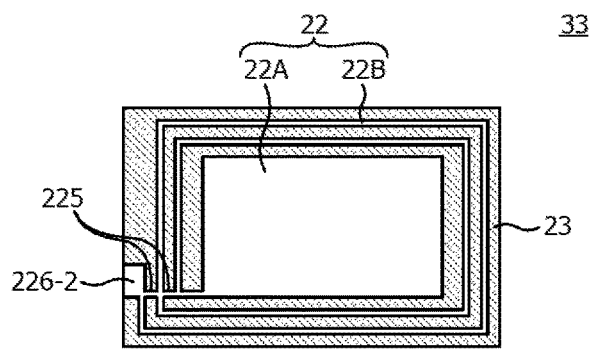
FIGS. 17A and 17B are views illustrating a crystal unit according to a third embodiment.
Figure 17B:
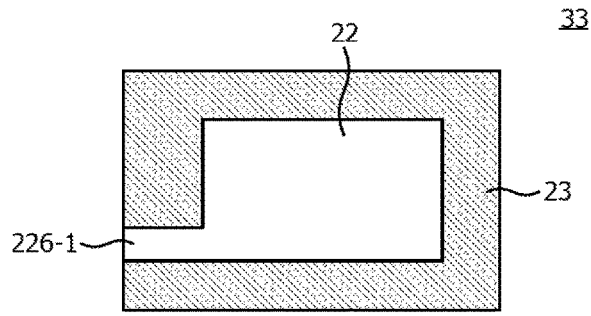

FIGS. 17A and 17B are views illustrating a crystal unit according to a third embodiment. In FIGS. 17A and 17B, substantially the same parts as those in FIGS. 7A to 7C will be denoted by the same reference numerals as used in FIGS. 7A to 7C, and explanation of which will be omitted. FIG. 17A is a top view of a crystal unit 33 as an example of a coil built-in crystal unit, and FIG. 17B is a bottom view of the crystal unit 33. Illustration of packages, electrodes or others is omitted in these figures.

In the third embodiment, one or more trimming points 225 are formed in a coil pattern 22B of an upper excitation electrode 22. In this embodiment, two trimming points 225 are formed. When an inductance corresponding to an extension coil is to be changed, the length of the coil pattern 22B is changed by trimming the trimming points 225 of the coil pattern 22B by, e.g., a laser beam. Accordingly, it is possible to fabricate the crystal unit 33 with a variable inductance corresponding to the extension coil. The trimming of the coil pattern 22B may be performed before and after the crystal unit 33 is accommodated in a package, or may be included in a fabrication process of the crystal unit. In addition, a trimming to change the width of the coil pattern 22B may be performed.

Figure 18A:
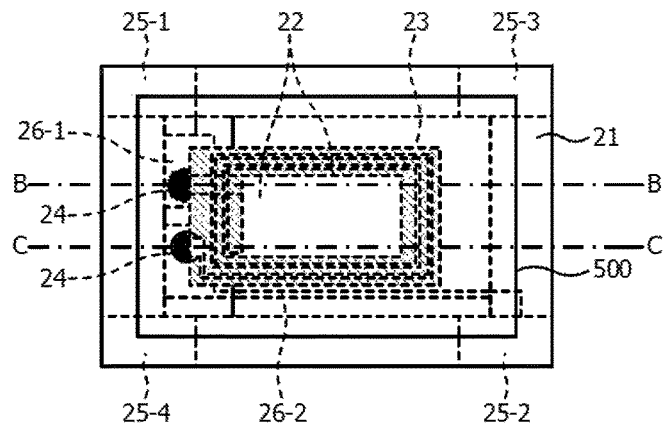
FIGS. 18A to 18C are views illustrating a state where the crystal unit in the fifth embodiment is accommodated in a package.
Figure 18B:
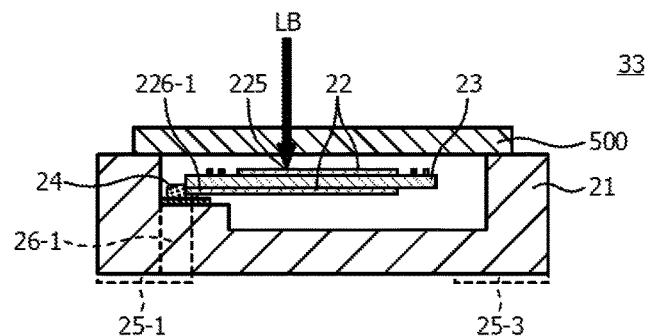
Figure 18C:
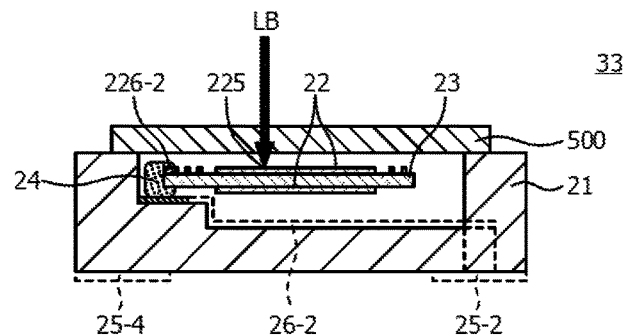

FIGS. 18A to 18C are views illustrating a state where the crystal unit in the third embodiment is accommodated in a package. In FIGS. 18A to 18C, substantially the same parts as those in FIGS. 2A to 2C and FIGS. 17A and 17B will be denoted by the same reference numerals as used in FIGS. 2A to 2C and FIGS. 17A and 17B, and explanation of which will be omitted. FIG. 18A is a plan view of a crystal unit 33, FIG. 18B is a sectional view of the crystal unit 33, which is taken along an alternate long and short dashed line B-B in FIG. 18A, and FIG. 18C is a sectional view of the crystal unit 33, which is taken along an alternate long and short dashed line C-C in FIG. 18A.

As illustrated in FIGS. 18A to 18C, a transparent lid 500 is formed at a position facing the coil pattern 22B of a package 21, and the crystal unit 33 is accommodated and sealed in the package 21. In this example, since the lid 500 is transparent, even after the crystal unit 33 is accommodated and sealed in the package 21, an inductance corresponding to an extension coil may be changed by trimming the trimming points 225 of the coil pattern 22B via the lid 500 by, e.g., a laser beam LB. The lid 500 may be made of, e.g., glass without being limited thereto.

It is to be understood that the lid need not be transparent for a package in which a crystal unit having an untrimmed coil pattern is accommodated.

Although it is illustrated in FIGS. 18A to 18C that the thickness of the lid 500 is exaggerated for convenience of explanation, the lid 500 may be formed to be thin and buried in the package 21. Therefore, the overall size (length, width and thickness) of the package 21 may be formed in the same manner as, e.g., the package 21 illustrated in FIGS. 2A to 2C. As a result, it is possible to install a coil without impairing the size of a coil built-in crystal unit.

In addition, in combination of the second and third embodiments, one or more trimming points may be formed in both of an upper coil pattern and a lower coil pattern. In this case, in order to trim a pattern of the lower coil pattern, a transparent window may be installed in a portion of the bottom of the package 21.

Figure 19A:
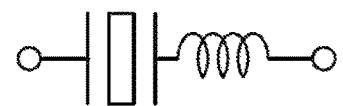
FIGS. 19A to 19C are views illustrating images of equivalent circuits of a crystal unit.
Figure 19B:
Figure 19C:

FIGS. 19A to 19C are views illustrating images of equivalent circuits of a crystal unit. FIG. 19A illustrates a schematic image of an equivalent circuit of the coil built-in crystal unit in the first embodiment, FIG. 19B illustrates a schematic image of an equivalent circuit of the coil built-in crystal unit in the second embodiment, and FIG. 19C illustrates a schematic image of an equivalent circuit of the coil built-in crystal unit in the third embodiment. Specifically, FIG. 19A illustrates an image where one excitation electrode of the crystal unit in the first embodiment is connected in series to a coil, FIG. 19B illustrates an image where both excitation electrodes of the crystal unit in the second embodiment are connected in series to a coil, and FIG. 19C illustrates an image where one excitation electrode of the crystal unit in the third embodiment is connected in series to a variable coil.

Figure 20A:
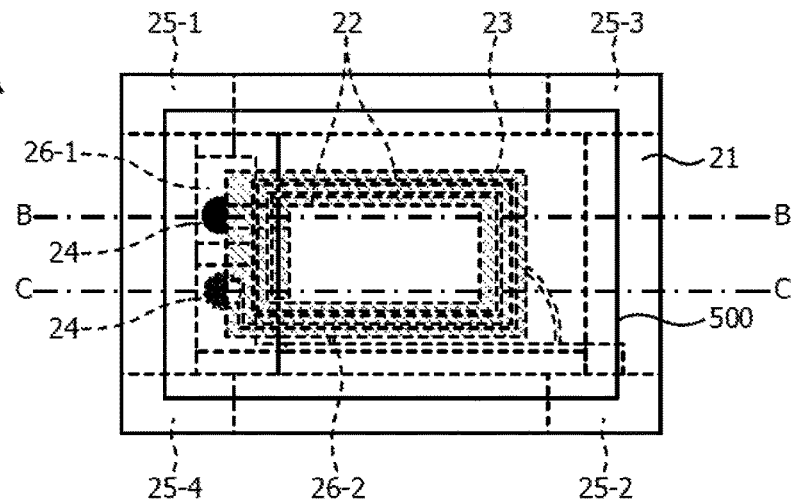
FIGS. 20A to 20C are views illustrating a crystal unit according to a fourth embodiment.
Figure 20B:
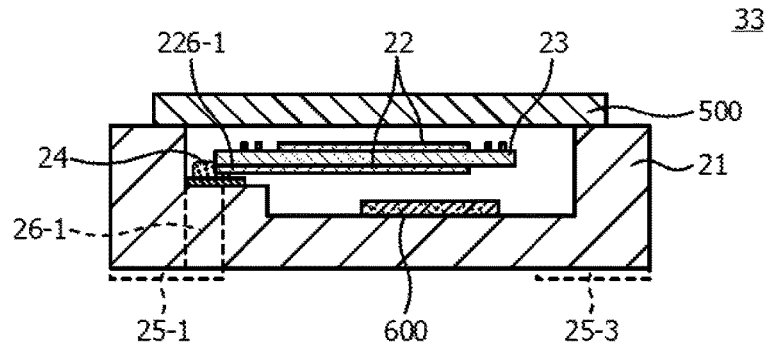
Figure 20C:
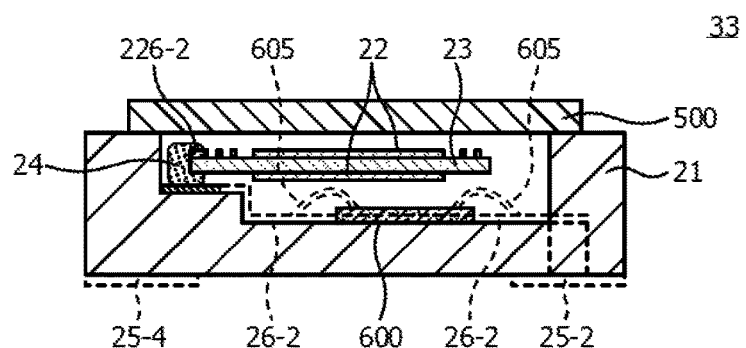

FIGS. 20A to 20C are views illustrating a state where the crystal unit in the fourth embodiment is accommodated in a package. In FIGS. 20A to 20C, substantially the same parts as those in FIGS. 7A to 7C and FIGS. 18A to 18C will be denoted by the same reference numerals as used in FIGS. 7A to 7C and FIGS. 18A to 18C, and explanation of which will be omitted. FIG. 20A is a plan view of a crystal unit 33, FIG. 20B is a sectional view of the crystal unit 33, which is taken along an alternate long and short dashed line B-B in FIG. 20A, and FIG. 20C is a sectional view of the crystal unit 33, which is taken along an alternate long and short dashed line C-C in FIG. 20A.

Figure 1:
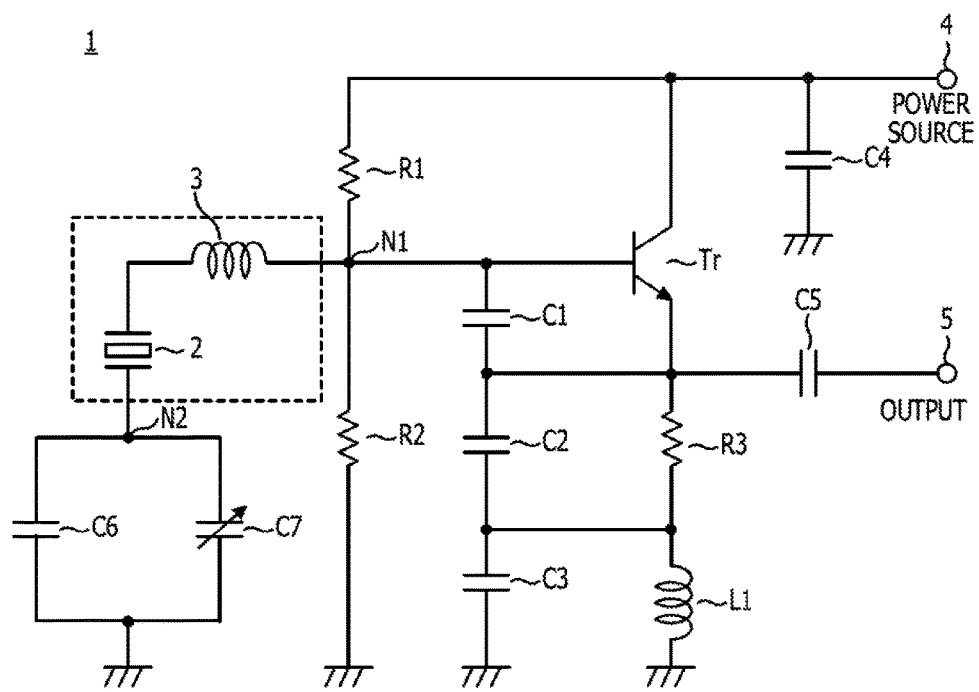
FIG. 1 is a circuit diagram illustrating an example of an oscillator.

Although the crystal unit 31 of the first embodiment illustrated in FIGS. 7A to 7C is accommodated and sealed in the package 21 illustrated in FIGS. 20A to 20C, it is to be understood that any one of the crystal units 32 or 33 of the second or third embodiments may be accommodated and sealed therein. An integrated circuit (IC) chip 600 is accommodated in the package 21. The IC chip 600 contains an oscillation circuit except for a portion surrounded by a broken line in FIG. 1. For example, a node N1 (see, e.g., FIG. 1) of the oscillation circuit in the IC chip 600 is electrically connected to the upper excitation electrode 22A of the crystal unit 31 by a wire bonding 605 via the wiring 26-2. In addition, a node N2 (see, e.g., FIG. 1) of the oscillation circuit is electrically connected to the lower excitation electrode 22 of the crystal unit 31 by another wire bonding 605 via the wiring 26-1.

In this case, the wiring 26-1 needs not be electrically connected to the electrode 25-1, and the wiring 26-2 needs not be electrically connected to the electrode 25-2. For example, the terminal 4 of the oscillation circuit may be electrically connected to the electrode 25-1 by a wiring boding (not illustrated) via a wiring (not illustrated), and the electrode 25-1 may be used as a power source terminal. In addition, the terminal 5 of the oscillation circuit may be electrically connected to the electrode 25-3 by a wiring boding (not illustrated) via a wiring (not illustrated), and the electrode 25-3 may be used as an output terminal. Further, the grand of the oscillation circuit may be electrically connected to the electrode 25-4 by a wiring boding (not illustrated) via a wiring (not illustrated), and the electrode 25-4 may be used as a grand terminal.

According to this embodiment, it is possible to fabricate a small oscillator including a crystal unit and an oscillation circuit accommodated in a package.

FIG. 21 is a table illustrating results of evaluation on a crystal unit mounting area, an inductance corresponding to an extension coil, and a crystal unit production cost for the conventional example illustrated in FIGS. 2A to 2C, the first to fourth comparative examples illustrated in FIGS. 3A to 6C, and the first to fourth embodiments illustrated in FIGS. 7A to 7C, FIGS. 16A to 16C, FIGS. 17A and 17B, and FIGS. 20A to 20C. In FIG. 21, "x" represents "impossible" as an evaluation result, "Δ" represents "possible" as an evaluation result, and "○" represents "good" as an evaluation result. As may be seen from FIG. 21, it is confirmed that each of the first to sixth embodiments may provide a smaller crystal unit mounting area than the conventional example and the first and second comparative examples, provide a larger inductance corresponding to the extension coil than the third comparative example, and provide a lower crystal unit production cost than the conventional example and the first to fourth comparative examples.

According to the above-described embodiments, it is possible to install a coil without impairing the size of a coil built-in crystal unit. In addition, according to the above-described embodiments, by forming an inductance component in an excitation electrode itself on a crystal substrate, it is possible to fabricate a coil built-in crystal unit and miniaturize the crystal unit and an oscillator.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A crystal unit comprising:
   a crystal substrate;
   a pair of excitation electrodes formed respectively on both surfaces of the crystal substrate; and
   a coil pattern formed around at least one of the pair of excitation electrodes, the other of the pair of excitation electrodes having a pattern serving as both an excitation electrode and a coil.

2. The crystal unit according to claim 1, wherein
   the coil pattern is a spiral pattern to surround an excitation electrode pattern of the at least one of the pair of excitation electrodes.

3. The crystal unit according to claim 1, further comprising
   another coil pattern formed around an excitation electrode pattern of the other of the at least one of the pair of excitation electrodes.

4. The crystal unit according to claim 1, wherein
   an inductance of the coil is variable.

5. The crystal unit according to claim 4, wherein
   the pattern has one or more trimming points trimmed when the inductance of the coil is changed.

6. The crystal unit according to claim 1, further comprising
   a package in which the crystal substrate and the pair of excitation electrodes are accommodated.

7. An oscillator comprising:
   a package;
   a crystal unit accommodated in the package, the crystal unit including;
      a crystal substrate;
      a pair of excitation electrodes formed respectively on both surfaces of the crystal substrate; and
      a coil pattern formed around at least one of the pair of excitation electrodes, the other of the pair of excitation electrodes having a pattern serving as both an excitation electrode and a coil; and
   an oscillation circuit accommodated in the package and electrically connected to the crystal unit.

8. A method for fabricating a crystal unit, the method comprising:
   forming a pair of electrode films on both surfaces of a crystal substrate, respectively;
   forming a coil pattern around at least one of a pair of excitation electrodes when patterning the pair of electrode films onto the pair of excitation electrodes; and
   forming the crystal unit by cutting an entire body into laminate units, each of which includes the crystal substrate and the pair of excitation electrodes.

9. The method according to claim 8, wherein the patterning includes:
   forming a resist on each of the electrode films;
   exposing the resist using a mask having a pattern formed on the resist;
   developing a pattern of the exposed resist;
   etching each of the electrode films using the developed pattern of the resist as a mask; and
   removing the resist.

10. The method according to claim 8, wherein, in the forming the coil pattern, the coil pattern is formed in a spiral pattern to surround an excitation electrode pattern of one of the pair of excitation electrodes.

11. The method according to claim 8, wherein
   the pattern is formed as a pattern having one or more trimming points trimmed when an inductance of the coil is changed.

12. The method according to claim 11, wherein
   the inductance of the coil is changed by trimming the one or more trimming points of the pattern.

* * * * *